(12) United States Patent
Mustafa et al.

(10) Patent No.: US 10,571,069 B2
(45) Date of Patent: Feb. 25, 2020

(54) GIMBAL ASSEMBLY FOR HEATER PEDESTAL

(71) Applicant: APPLIED MATERIALS, INC., Santa Clara, CA (US)

(72) Inventors: Muhannad Mustafa, Santa Clara, CA (US); Muhammad M. Rasheed, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 192 days.

(21) Appl. No.: 15/719,985

(22) Filed: Sep. 29, 2017

(65) Prior Publication Data

US 2019/0078725 A1 Mar. 14, 2019

Related U.S. Application Data

(60) Provisional application No. 62/558,852, filed on Sep. 14, 2017.

(51) Int. Cl.
| | | |
|---|---|---|
| *C23C 16/458* | (2006.01) | |
| *F16M 11/12* | (2006.01) | |
| *H01J 37/32* | (2006.01) | |

(52) U.S. Cl.
CPC ....... *F16M 11/123* (2013.01); *C23C 16/4584* (2013.01); *C23C 16/4586* (2013.01); *H01J 37/32724* (2013.01); *H01J 37/32733* (2013.01)

(58) Field of Classification Search
CPC .................................................. C23C 16/4584
See application file for complete search history.

(56) References Cited

U.S. PATENT DOCUMENTS

| | | | |
|---|---|---|---|
| 7,871,470 B2 | 1/2011 | Schieve et al. | |
| 2001/0000775 A1 | 5/2001 | Zuniga et al. | |
| 2003/0198005 A1* | 10/2003 | Sago .................. | B23Q 3/154 361/234 |
| 2008/0017116 A1 | 1/2008 | Campbell et al. | |
| 2010/0294199 A1* | 11/2010 | Tran .................. | C23C 16/4401 118/723 R |
| 2014/0315473 A1 | 10/2014 | Chen et al. | |
| 2014/0367587 A1 | 12/2014 | McRay | |
| 2015/0276119 A1 | 10/2015 | Booker | |

FOREIGN PATENT DOCUMENTS

| | | |
|---|---|---|
| EP | 1 202 330 A2 | 10/2001 |
| KR | 10-2011-0121099 A | 11/2011 |

OTHER PUBLICATIONS

International Search Report and Written Opinion dated Dec. 13, 2018 for PCT Application No. PCT/US2018/048687.
U.S. Appl. No. 15/421,964, filed Feb. 1, 2017, Rasheed et al.
U.S. Appl. No. 15/661,441, filed Jul. 27, 2017, Mustafa et al.

* cited by examiner

*Primary Examiner* — Joseph A Miller, Jr.
(74) *Attorney, Agent, or Firm* — Moser Toboada; Alan Taboada

(57) ABSTRACT

Embodiments of the present disclosure are directed to a gimbal assembly, that includes a gimbal plate having a central opening, a pivot screw disposed within a pivot mount formed in the gimbal plate, wherein the pivot screw includes a spherical pivot head about which the gimbal plate pivots, one or more motors coupled to the gimbal plate configured to provide in-situ gimbal plate motion about the spherical pivot head, and a plurality of leveling indicators configured that determine deflection of gimbal plate.

16 Claims, 3 Drawing Sheets

GIMBAL ASSEMBLY FOR HEATER PEDESTAL

FIELD

The present disclosure relates generally to apparatus and methods for improving deposition uniformity. In particular, embodiments of the disclosure are directed to a gimbal assembly for a heater pedestal.

BACKGROUND

Edge non-uniformity of metal deposition or etch on substrates has been found in many products especially in plasma processing environments. The edge non-uniformity may be film thickness and property non-uniformity, and may be edge-to-edge non-uniformity or center-to-edge non-uniformity.

In many deposition chambers, both atomic layer deposition and chemical vapor deposition, rotating pedestal/heaters are used to improve/reduce non-uniformity. In most cases, non-uniformity comes from non-uniform chemical delivery, flow distribution, chamber features, and temperature non-uniformity from the chamber body and surrounding components. Using a rotating pedestal can distribute the local effect of these variations and improve the non-uniformity.

However, the inventors have found that undesirable edge non-uniformity still exists in many cases. Therefore, there is a need in the art for apparatus and methods to reduce edge-to-edge and center-to-edge non-uniformity during metal deposition or etch processes on substrates.

SUMMARY

Embodiments of the present disclosure are directed to a gimbal assembly for a heater pedestal. In some embodiments the gimbal assembly includes a gimbal plate having a central opening, a pivot screw disposed within a pivot mount formed in the gimbal plate, wherein the pivot screw includes a spherical pivot head about which the gimbal plate pivots, one or more motors coupled to the gimbal plate configured to provide in-situ gimbal plate motion about the spherical pivot head, and a plurality of leveling indicators configured that determine deflection of gimbal plate.

In some embodiments, a process chamber including a chamber body having sidewalls, a bottom, and a lid assembly that encloses a process volume, a showerhead coupled to the lid assembly, a rotatable heater pedestal disposed in the process volume and coupled to a pedestal shaft, and a gimbal assembly comprising a gimbal plate coupled to a gimbal support structure and having a central opening through which the pedestal shaft is disposed, a pivot screw disposed within a pivot mount formed in the gimbal plate, wherein the pivot screw includes a spherical pivot head about which the gimbal plate pivots, one or more motors coupled to the gimbal plate configured to provide in-situ gimbal plate motion about the spherical pivot head, and a plurality of leveling indicators configured that determine deflection of gimbal plate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
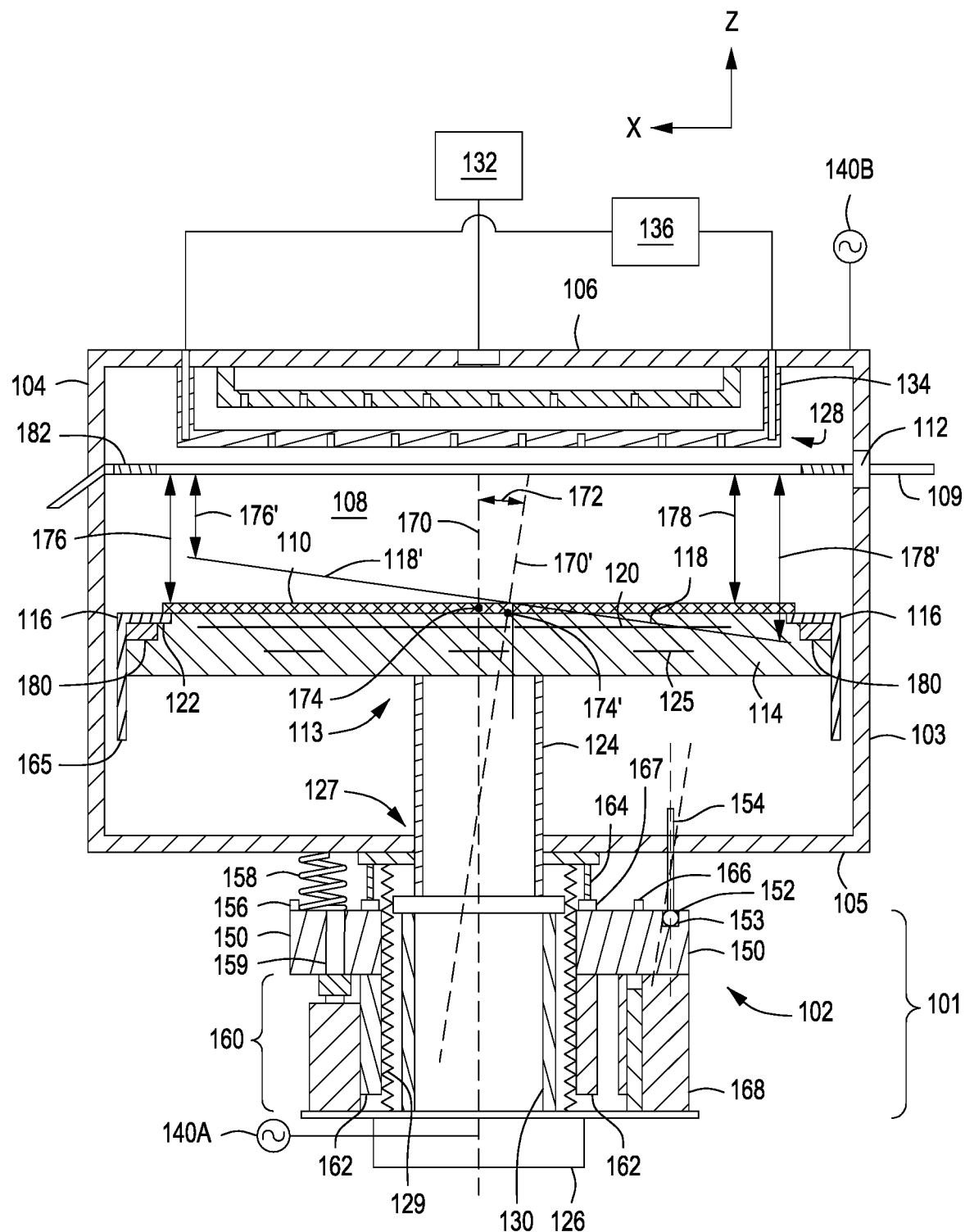
FIG. 1 shows a side cross-sectional view of a processing chamber including a gimbal assembly in accordance with one or more embodiment of the disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure are directed to a gimbal assembly for a heater pedestal. In embodiments consistent with the present disclosure, the inventive gimbal design changes the distance between the anode (e.g., chamber lid, shower head, target, etc.) and the cathode (e.g., the pedestal) which plays a dominant role in controlling the strength of the electric field generated at the surface of the substrate. More specifically, the inventive gimbal assembly can change the spacing at the edges such that the distance between the cathode and the anode on one side of the pedestal is different from the distance between the cathode and the anode on another side of the pedestal. The inventive gimbal assembly can gimbal the pedestal about both the X and Y axis. In addition, the gimbal assembly may be used with rotating pedestals that rotate about the Z axis. Thus, the gimbal assembly described herein advantageously improves edge-to-edge uniformity as well as center-to-edge uniformity in both rotating pedestal and non-rotating pedestal chamber configurations.

FIG. 1 depicts a side cross-sectional view of a process chamber 100 in accordance with one or more embodiment of the disclosure. First, the general configuration of a process chamber is described followed by more specific embodiments directed to the gimbal assembly 101 for use with an in-chamber heater and substrate rotating mechanism.

The process chamber 100 includes a chamber body 104 with a sidewall 103, a bottom 105 and a removable lid assembly 106 that encloses a process volume 108. The substrate support system 102 is at least partially disposed in the process volume 108 and can support a substrate 110 that has been transferred to the process volume 108 through a port 112 formed in the chamber body 104. A process kit is included in the processing volume 108 that includes at least one of an upper edge ring 116, a lower edge ring 180, a bottom plate (not shown), and/or a shadow ring 182.

The substrate support system 102 includes a primary substrate support 113, such as a pedestal 114 and a thermal element 120. In addition, portions of the process kit comprise a secondary substrate support 115, such as an upper edge ring 116 and lower edge ring 180. The secondary substrate support 115 may be used to intermittently support the substrate 110 above the primary substrate support 113. The pedestal 114 includes a support surface 118 that is adapted to contact (or be in proximity to) a major surface of the substrate 110 during processing. Thus, the pedestal 114 serves as a primary supporting structure for the substrate 110 in the process chamber 100. The upper edge ring 116 is shown supported by a peripheral shoulder 122 formed around the circumference of the thermal element 120. The upper edge ring 116 has a foot 165 to support the upper edge ring 116 when in the lowered position.

The pedestal 114 may include a thermal element 120 to control the temperature of the substrate 110 during processing. The thermal element 120 can be, for example, a heater or cooler that is positioned on top of the pedestal 114 or within the pedestal. The heater or cooler can be a separate component that is coupled to the top of the pedestal 114 or can be an integral part of the pedestal 114. In some embodiments, the thermal element 120 is embedded within the pedestal body (as shown in FIG. 1). In one or more embodiment, the embedded thermal element 120 may be a heating or cooling element or channel, utilized to apply thermal energy to the pedestal 114 body that is absorbed by the substrate 110. Other elements may be disposed on or embedded within the pedestal 114, such as one or more electrodes, sensors and/or vacuum ports. The temperature of the substrate 110 may be monitored by one or more temperature detection devices such as an Resistance Temperature Detector (RTD) or thermocouple. The embedded thermal element 120 may be zone controlled such that temperature at different areas of the pedestal 114 body may be individually heated or cooled. However, due to extenuating factors, such as imperfections in the pedestal 114 and/or non-uniformities in the substrate 110, the embedded thermal element 120 may not be able to apply thermal energy uniformly across the entire support surface 118 and/or the substrate 110. These extenuating factors can create non-uniform temperature distribution across the substrate 110, which can result in non-uniform processing of the substrate.

The pedestal 114 can be coupled to an actuator 126 via the shaft assembly comprised of an upper pedestal shaft 124 and lower shaft 130 that provides one or more of vertical movement (in the z-axis), rotational movement (about z-axis) and may also provide angular movement (about x and y axis). Vertical movement may be provided by the actuator 126 to allow the substrate 110 to be transferred between the upper edge ring 116 and the support surface 118. Angular movement about the x and y axis is provided by the gimbal assembly 101. The shaft assembly passes through the bottom 105 of the processing chamber 100 via opening 127. An isolated processing environment can be preserved by bellows 129 surrounding opening 127 and connected to a portion of the shaft assembly.

The substrate 110 is brought into the process volume 108 by robot 109 through port 112 in the sidewall 103 of the process chamber 100. The port 112 can be, for example, a slit valve.

The process chamber 100 may be a CVD, ALD or other type of deposition chamber, an etch chamber, an ion implant chamber, a plasma treatment chamber, or a thermal process chamber, among others. In the embodiment shown in FIG. 1, the process chamber is a deposition chamber and includes a showerhead assembly 128. The process volume 108 may be in selective fluid communication with a vacuum system to control pressures therein. The showerhead assembly 128 may be coupled to a process gas source 132 to provide process gases to the process volume 108 for depositing materials onto the substrate 110. The showerhead assembly 128 may also include a temperature control element 134 for controlling the temperature of the showerhead assembly 128. The temperature control element 134 may be a fluid channel that is in fluid communication with a coolant source 136.

In some embodiments, the pedestal 114 may be an electrostatic chuck and the pedestal 114 may include one or more electrodes 125 (as shown in FIG. 1). For example, the pedestal 114 may be coupled to a power element 140A that may be a voltage source providing power to the one or more electrodes 125. The voltage source may be a radio frequency (RF) controller or a direct current (DC) controller. In another example, the pedestal 114 may be made of a conductive material and function as a ground path for RF power from a power element 140B distributed by the showerhead assembly 128. Thus, the process chamber 100 may perform a deposition or etch process utilizing RF or DC plasmas. As these types of plasmas may not be perfectly concentric or symmetrical, RF or DC hot spots (i.e., electromagnetic hot spots) may be present on the substrate 110. These electromagnetic hot spots may create non-uniform deposition or non-uniform etch rates on the surface of the substrate 110.

Figure 2:
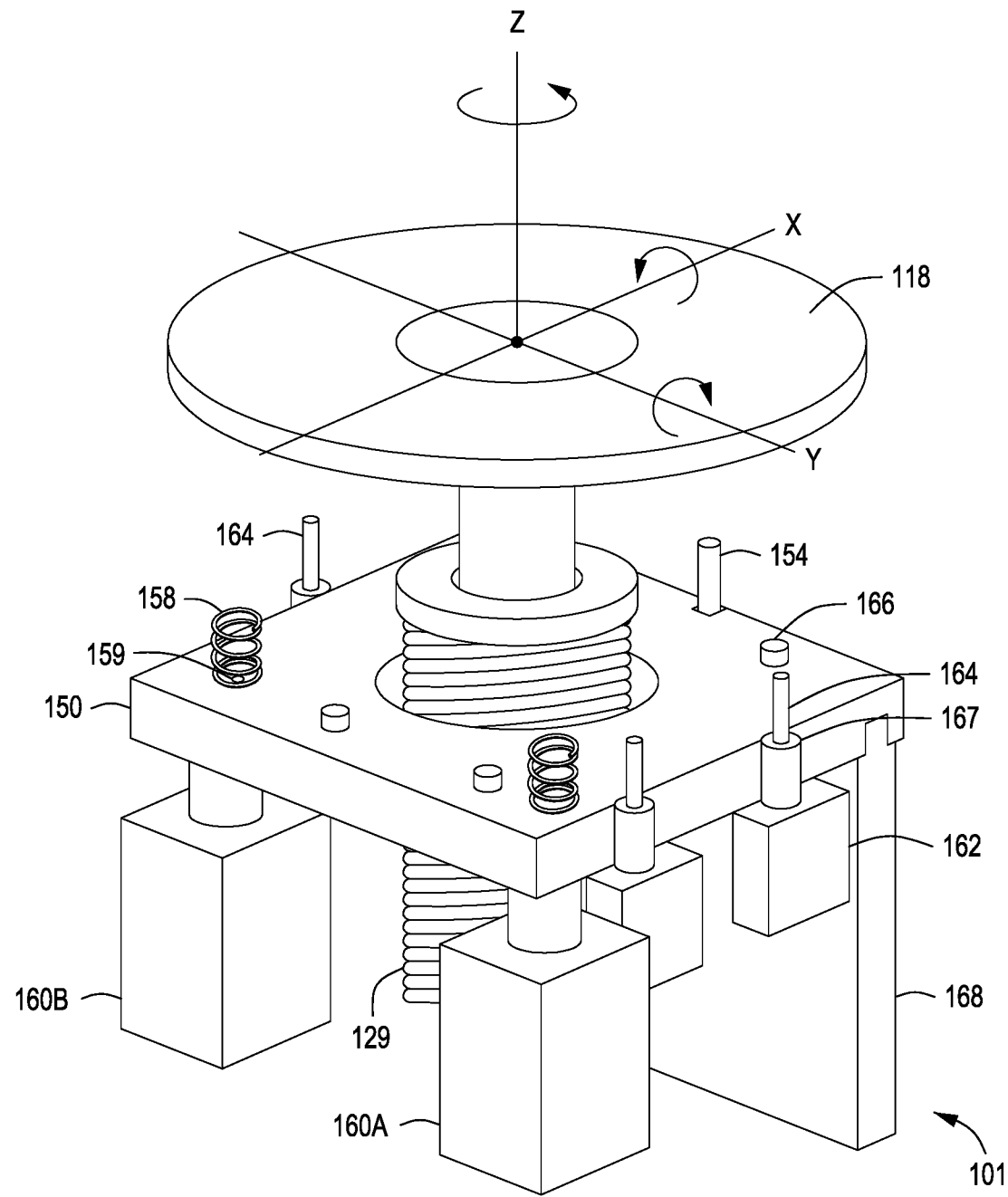
FIG. 2 depicts an isometric view of the gimbal assembly in accordance with one or more embodiment of the disclosure.

In addition, as noted above, non-uniformity may come from non-uniform chemical delivery, flow distribution, chamber features, and temperature non-uniformity from the chamber body and surrounding components. Embodiments consistent with the inventive gimbal assembly 101 shown in FIGS. 1 and 2 advantageously counters the non-uniformity that may be present on the surface of the substrate by enabling in-situ gimbal movement of an RF biasable heater during substrate processing; thus, improving edge-center-edge non-uniformity. FIGS. 1 and 2 are discussed below with respect to the gimbal assembly 101.

The gimbal assembly 101 consists of a gimbal plate 150 that is secured on one end by a gimbal support structure 168. The gimbal plate 150 pivots about a pivot screw 154. In some embodiments, the post may be a flexible pivot screw having a spherical pivot head 152 that is disposed within a pivot mount 153 formed in the gimbal plate. The pivot screw 154 may be pivoted to about 20 degrees off the vertical Z-axis in any direction. That is, the gimbal assembly 101 can move the heater pedestal 118 from about 0° to about 20° from vertical about the X and Y axis, or combination thereof. As shown in FIG. 1, in some embodiments, the top of the pivot screw 154 extends through, and is secured by, the bottom of the chamber. As shown in FIG. 1, the heater pedestal 118, the upper shaft 124, the lower shaft 130, and the bellows are all coupled to the gimbal plate 150. Thus, as the gimbal plate 150 moves, so do the heater pedestal 118, the upper shaft 124, the lower shaft 130, and the bellows move.

The gimbal assembly 101 includes one or more motors 160 that provide in-situ linear gimbal plate motion about the spherical pivot head 152. In some embodiments, at least two motors 160A and 160B are coupled to the gimbal plate 150. In some embodiments, the first motor 160A may be used to provide coarse gimbal plate adjustment, while the second motor 160B may be used to provide fine gimbal plate adjustments. In some embodiments, the high resolution gimbal motor will provide 5 mils wobbling of the gimbal plate 150 per 360 degree rotation of each motor. Rotation of the motors 160 (e.g., 160A and 160B) causes coaxial annular screws 159 coupled to those motors to turn and move the gimbal plate 150 up or down based on the direction the coaxial annular screws 159 are turned. Each motor 160A and 160B may be independently controlled to move the associated screw as desired. In some embodiments, the coaxial annular screws 159 are spring loaded screws that include springs 158 disposed between the gimbal plate 150 and the bottom 105 of the processing chamber 100. The motors 160 and coaxial annular spring loaded screws 159 are designed to gimbal the heater pedestal during processing and under strong vacuum conditions.

The gimbal assembly includes a plurality of leveling indicators 162 that determine the deflection during gimbal movement. In some embodiments, the deflection is measured between the top surface of the gimbal plate 150 and the bottom surface of the chamber body using the spring loaded leveling indicator posts 164 disposed between top surface of the gimbal plate 150 and the bottom surface of the chamber body. The leveling indicator 162 and leveling indicator posts 164 are secured to the gimbal plate 150 using clamps 167. The gimbal assembly 101 is typically installed such that the surface of the gimbal plate 150 and the surface of the heater pedestal 118 are in parallel. Therefore, the distance measured with indicators 162 will represent the in-situ gimbal profile of the heater pedestal inside the chamber. In some embodiments, four leveling indicators are used to most accurately detect the gimbal position of the heater pedestal 118. In some embodiments, an initial angle about the X or Y axis is used to achieve a certain deposition thickness profile.

The disclosure may be practiced using other semiconductor substrate processing systems wherein the processing parameters may be adjusted to achieve acceptable characteristics by those skilled in the art by utilizing the teachings disclosed herein without departing from the spirit of the disclosure.

In some embodiments, the gimbal assembly further includes a plurality of hard-stops 156, 166 attached to the surface of the gimbal plate 150 to avoid any failure and damage of heater pedestal inside the chamber under vacuum during gimbal movement.

In the embodiments discussed herein, the heater pedestal 118 may be a rotating pedestal about the Z-axis or may be a fixed pedestal. A rotating heater pedestal 118 typically provides additional advantages. For example, with a rotating pedestal, not as much gimbal movement is required (e.g., a process may only need to gimbal in one direction as the rotation of the pedestal will ensure all edges of the substrate are similarly gimbaled. In embodiments consistent with the present disclosure, the heater pedestal 118 can have both in-situ gimbal movement about the X and Y axis, and rotation about the Z-axis, simultaneously during substrate processing.

Figure 3:
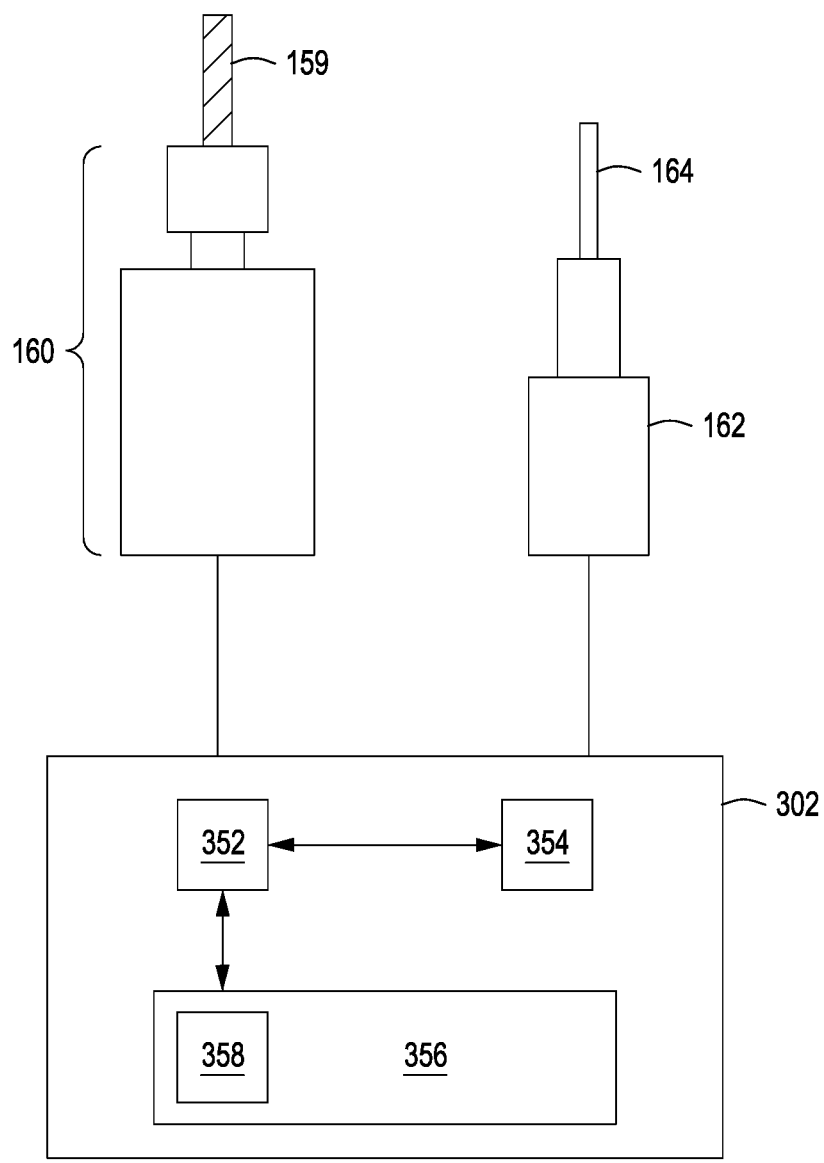
FIG. 3 depicts a schematic view of the gimbal assembly motors and controller in accordance with one or more embodiment of the disclosure.

In some embodiments, the motors 160 will be operated by software through a gimbal controller 302 as shown in FIG. 3. A gimbal profile can be set in software and can be self-adjusted with feedback signals from the plurality of indicators 162. The leveling indicators 162 will send gimbal position information to the controller 302. In some embodiments, gimbal position information is digitized and can be used to produce a digital map of how the heater pedestal is actually gimbaling. In some embodiments, the gimbal controller will include a display to show the gimbal position map. To facilitate control of the gimbal motors 160 and movement of the gimbal plate 150, the gimbal controller 302 may be any form of general-purpose computer processor that can be used in an industrial setting for controlling various chambers and sub-processors. The memory, or computer-readable medium, 356 of the CPU 352 may be one or more of readily available memory such as random access memory (RAM), read only memory (ROM), floppy disk, hard disk, or any other form of digital storage, local or remote. The support circuits 354 are coupled to the CPU 352 for supporting the processor in a conventional manner. These circuits include cache, power supplies, clock circuits, input/output circuitry and subsystems, and the like.

Any inventive methods disclosed herein may generally be stored in the memory 356 as a software routine 358 that, when executed by the CPU 352, causes the gimbal assembly 101 to perform processes of the present disclosure. The software routine 358 may also be stored and/or executed by a second CPU (not shown) that is remotely located from the hardware being controlled by the CPU 352. Some or all of the method of the present disclosure may also be performed in hardware. As such, the disclosure may be implemented in software and executed using a computer system, in hardware as, e.g., an application specific integrated circuit or other type of hardware implementation, or as a combination of software and hardware. The software routine 358 may be executed after the substrate 110 is positioned on the substrate support 108. The software routine 358, when executed by the CPU 352, transforms the general purpose computer into a specific purpose computer (gimbal controller) 302 that control the gimbal assembly operation such that the methods disclosed herein are performed.

Referring back to FIG. 1, the heater pedestal 118 is shown in an un-gimbaled position (i.e., 0° off the vertical centerline 170 of the pedestal 118 and shaft 124). The distances 176 and 178 of the edges of the substrate 110 from the showerhead 128 are the same. When the heater pedestal 118 is moved/gimbaled about the X and or Y axis using the gimbal assembly 101, the edge vertical distances between substrate 110 and showerhead 128 can be changed. For example, if the gimbal assembly 101 moves the heater pedestal 118 to an angle 172 greater or less than zero off the centerline 170 to centerline 170', the distance 176 between the substrate 110 and the showerhead 128 will decrease as shown by 176', and the distance 178 between the substrate 110 and the showerhead 128 will decrease as shown by 178'. For example, if the heater pedestal 118 is gimbaled to 10°, the edge vertical distances 176 and 178 would change 11.6 sin (10)=2 in. This will lead to a change in the strength of the electric field that is generated by the plasma inside the chamber at edges, and a change in plasma density. This distance can be adjusted based on the non-uniformity profile of the metal deposition or etch on the substrate 110.

In addition, when the heater pedestal 118 is moved/gimbaled about the X and or Y axis using the gimbal assembly 101, the center 174 of substrate 110 can be offset to 174', for example, improve center to edge non-uniformity. For example, if the heater pedestal 118 is gimbaled to 10°, the center offset of 174 would be 4.92 cos (10)=0.074 in. Center to edge non-uniformity is caused due to pressure differences from one edge to another edge. One edge may experience gas pumping effects and the other edge may not. That may cause the formation of a low pressure side and a high pressure where there is gas pumping causing a gas cross-flow that contributes to the non-uniformity. Although rotating the pedestal about the Z-Axis will help edge-edge uniformity, the center 174 will not move, so there may still exist some center to edge non-uniformity. Embodiments consistent with the inventive gimbal assembly 101 can move the center 174 to improve uniformity.

While the foregoing is directed to embodiments of the present disclosure, other and further embodiments of the disclosure may be devised without departing from the basic scope thereof.

The invention claimed is:
1. A gimbal assembly, comprising:
a gimbal plate having a central opening;

a pivot screw disposed within a pivot mount formed in the gimbal plate, wherein the pivot screw includes a spherical pivot head about which the gimbal plate pivots;

at least two motors coupled to the gimbal plate configured to provide in-situ gimbal plate motion about the spherical pivot head, wherein the at least two motors are coupled to coaxial annular screws that provide gimbal plate adjustment based on the direction the coaxial annular screws are turned; and a plurality of leveling indicators configured to determine deflection of the gimbal plate.

2. The gimbal assembly of claim 1, wherein the pivot screw pivots up to about 20° off the vertical Z-axis in any direction.

3. The gimbal assembly of claim 1, wherein each coaxial annular screw provides up to 5 mils of wobbling of the gimbal plate per 360 degree rotation of the motor.

4. The gimbal assembly of claim 3, wherein the at least two motors are independently controllable to turn the associated coaxial annular screw.

5. The gimbal assembly of claim 4, wherein each coaxial annular screw is spring loaded and includes a spring disposed on a top surface of the gimbal plate.

6. The gimbal assembly of claim 5, wherein the at least two motors and spring loaded coaxial annular screws are configured to gimbal heater pedestal in a semiconductor process chamber during processing and under strong vacuum conditions.

7. A gimbal assembly, comprising:
a gimbal plate having a central opening;
a pivot screw disposed within a pivot mount formed in the gimbal plate, wherein the pivot screw includes a spherical pivot head about which the gimbal plate pivots;
one or more motors coupled to the gimbal plate configured to provide in-situ gimbal plate motion about the spherical pivot head;
at least two motors coupled to the gimbal plate configured to provide in-situ gimbal plate motion about the spherical pivot head, wherein the at least two motors includes a first motor and coaxial annular screw that provides coarse gimbal plate adjustment, and a second motor and coaxial annular screw that provides fine gimbal plate adjustments; and
a plurality of leveling indicators configured to determine deflection of the gimbal plate.

8. The gimbal assembly of claim 1, wherein each of the plurality of leveling indicators includes a spring loaded leveling indicator post.

9. The gimbal assembly of claim 1, further comprising a plurality of hard-stops attached to a surface of the gimbal plate.

10. The gimbal assembly of claim 1, further comprising a gimbal controller communicatively coupled to each of the one or more motors and each of the plurality of leveling indicators.

11. A process chamber including a rotatable substrate support heater pedestal, comprising:
a chamber body having sidewalls, a bottom, and a lid assembly that encloses a process volume;
a showerhead coupled to the lid assembly;
a rotatable heater pedestal disposed in the process volume and coupled to a pedestal shaft; and
a gimbal assembly comprising:
a gimbal plate coupled to a gimbal support structure and having a central opening through which the pedestal shaft is disposed;
a pivot screw disposed within a pivot mount formed in the gimbal plate, wherein the pivot screw includes a spherical pivot head about which the gimbal plate pivots, wherein a top of the pivot screw extends through, and is secured by, the bottom of the process chamber;
one or more motors coupled to the gimbal plate configured to provide in-situ gimbal plate motion about the spherical pivot head; and
a plurality of leveling indicators configured to determine deflection of the gimbal plate.

12. The process chamber of claim 11, wherein the gimbal assembly is configured to move the heater pedestal from about 0° to about 20° from vertical about the X axis and from about 0° to about 20° from vertical about the Y axis.

13. The process chamber of claim 11, wherein the heater pedestal and pedestal shaft are coupled to the gimbal plate, and wherein movement of the gimbal plate moves the heater pedestal and pedestal shaft.

14. The process chamber of claim 11, wherein the one or more motors are coupled to coaxial annular screws that provide gimbal plate adjustment based on the direction the coaxial annular screws are turned.

15. The process chamber of claim 14, wherein each coaxial annular screw provides up to 5 mils of wobbling of the gimbal plate per 360 degree rotation of the motor.

16. The process chamber of claim 14, wherein each coaxial annular screw is spring loaded and includes a spring disposed between the gimbal plate and the bottom of the processing chamber.

* * * * *